(12) United States Patent
Schwind et al.

(10) Patent No.: US 10,325,750 B2
(45) Date of Patent: *Jun. 18, 2019

(54) COLLISION IONIZATION SOURCE (71) Applicant: FEI Company, Hillsboro, OR (US)

(72) Inventors: Gregory A. Schwind, Portland, OR (US); Aurelien Philippe Jean Maclou Botman, Portland, OR (US); Sean Kellogg, Portland, OR (US); Leon van Kouwen, Rotterdam (NL); Luigi Mele, Eindhoven (NL)

(73) Assignee: FEI COMPANY, Hillsboro, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 15/874,798

(22) Filed: Jan. 18, 2018

(65) Prior Publication Data

US 2018/0211807 A1 Jul. 26, 2018

Related U.S. Application Data

(63) Continuation of application No. 15/405,139, filed on Jan. 12, 2017, now Pat. No. 9,899,181.

(51) Int. Cl.
*H01J 27/20* (2006.01)
*H01J 37/08* (2006.01)
*H01J 37/26* (2006.01)

(52) U.S. Cl.
CPC ............ *H01J 27/20* (2013.01); *H01J 27/205* (2013.01); *H01J 37/08* (2013.01); *H01J 37/26* (2013.01); *H01J 2237/006* (2013.01); *H01J 2237/061* (2013.01); *H01J 2237/082* (2013.01)

(58) Field of Classification Search
CPC ............ H01J 27/20; H01J 37/08; H01J 37/26
USPC .............................................. 250/423 R, 424
See application file for complete search history.

(56) References Cited

U.S. PATENT DOCUMENTS

| 4,500,787 A | 2/1985 | Poole et al. |
| 4,670,685 A | 6/1987 | Clark et al. |
| 4,933,551 A | 6/1990 | Bernius et al. |
| 5,083,061 A | 1/1992 | Koshiishi et al. |
| 5,300,785 A | 4/1994 | Aitken |
| 6,218,672 B1 | 4/2001 | Alig |
| 6,545,269 B1 | 4/2003 | Pierrejean et al. |

(Continued)

FOREIGN PATENT DOCUMENTS

| CN | 1477984 A | 2/2004 |
| CN | 101026080 A | 8/2007 |

(Continued)

OTHER PUBLICATIONS

"Electron Microscope", Wikipedia, Retrieved from the Internet Oct. 15, 2015, http://en.wikipedia.org/wiki/Electron_microscope, 11 pages.

(Continued)

*Primary Examiner* — Nicole M Ippolito
*Assistant Examiner* — Hanway Chang
(74) *Attorney, Agent, or Firm* — Denton W. McAlister (57) ABSTRACT

A collision ionization source is disclosed herein. An example source includes an ionization region arranged to receive a gas and a charged particle beam, the charged particle beam to ionize at least some of the gas, and a supply duct arranged to provide the gas to the ionization region, the supply duct having a non-uniform height decreasing from an input orifice to an output orifice, the output orifice arranged adjacent to the ionization region.

20 Claims, 4 Drawing Sheets

(56) References Cited

U.S. PATENT DOCUMENTS

| | | |
|---|---|---|
| 6,693,282 B1 | 2/2004 | Tiemeijer |
| 7,241,361 B2 | 7/2007 | Keller et al. |
| 7,442,942 B2 | 10/2008 | Takahashi et al. |
| 7,772,564 B2 | 8/2010 | Kruit et al. |
| 7,968,855 B2 | 6/2011 | Frosien |
| 8,076,650 B2 | 12/2011 | Smith et al. |
| 8,168,957 B2 | 5/2012 | Keller et al. |
| 8,253,118 B2 | 8/2012 | Zhang et al. |
| 8,405,054 B2 | 3/2013 | Smith et al. |
| 8,445,870 B2 | 5/2013 | Zhang et al. |
| 8,455,822 B2 | 6/2013 | Rue |
| 2003/0057378 A1 | 3/2003 | Pierrejean et al. |
| 2006/0097645 A1 | 5/2006 | Horsky |
| 2007/0262263 A1 | 11/2007 | Kruit et al. |
| 2008/0142702 A1 | 6/2008 | Frosien et al. |
| 2009/0309018 A1 | 12/2009 | Smith et al. |
| 2010/0108902 A1 | 5/2010 | Frosien et al. |
| 2011/0272593 A1 | 11/2011 | Graf et al. |
| 2012/0056088 A1 | 3/2012 | Rue |
| 2012/0168638 A1 | 7/2012 | Parker |
| 2012/0217152 A1 | 8/2012 | Miller |
| 2012/0280136 A1 | 11/2012 | Zhang et al. |
| 2012/0319000 A1 | 12/2012 | Keller et al. |
| 2013/0015765 A1 | 1/2013 | Graupera et al. |
| 2013/0112890 A1 | 5/2013 | Parker et al. |
| 2013/0134307 A1 | 5/2013 | Routh |
| 2013/0140450 A1 | 6/2013 | Graupera et al. |
| 2013/0248490 A1 | 9/2013 | Rasmussen et al. |
| 2014/0001372 A1 | 1/2014 | Schwind et al. |

FOREIGN PATENT DOCUMENTS

| | | |
|---|---|---|
| CN | 101384747 B | 11/2013 |
| EP | 2088613 A1 | 8/2009 |
| JP | H03276546 | 12/1991 |

OTHER PUBLICATIONS

"Focused Ion Beam", Wikipedia, Retrieved from the Internet Jul. 11, 2016, https://en.wikipedia.org/wiki/Focused_ion_beam, 7 pages.

"Nanolithography", Wikipedia, Retrieved from the Internet Apr. 3, 2017, https://en.wikipedia.org/wiki/Nanolithography, 4 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Jun, David Sangbom, "Development of the Nano-Aperture Ion Source (NAIS)," ISBN 978-94-6186-384-3, 2014, 151 pages:repository.tudelft.nl/islandora/object/uuid:23a0ceae-2662-4f6a-9082-f21d1a872a39/?collection=research.

Varentsov, D. et al. "First biological images with high-energy proton microscopy", Physica Medica (2013), pp. 208-213, vol. 29.

COLLISION IONIZATION SOURCE

PRIORITY INFORMATION

This application is a continuation of U.S. application Ser. No. 15/405,139, filed Jan. 1, 2017, which is incorporated herein for all purposes.

FIELD OF THE INVENTION

The invention relates generally to ion sources, and more specifically relates to a collision ionization ion source.

BACKGROUND

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:

A particle source, such as a Schottky electron source or ion source.

An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.

A specimen holder, on which a specimen under investigation can be held and positioned (e.g. tilted, rotated). If desired, this specimen holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.

A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) will be used to (concurrently) modify (machine/process) the specimen, whereby the specimen holder can be positioned in multiple degrees of freedom so as to suitably "present" a surface of the specimen to the employed electron/ion beams.

In the case of a transmission-type microscope (such as a(n) (S)TEM, for example), a CPM will specifically comprise:

An imaging system (imaging particle-optical column), which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In a lithography imager (e.g. wafer stepper/wafer scanner), an actinic beam of radiation is used to pattern an energy-sensitive later of material (photoresist) that has been provided (e.g. spin-coated) on a surface of a substrate (e.g. semiconductor wafer).

Conventionally, the actinic beam has comprised a broad beam of photons (e.g. from a mercury lamp or laser), which pass through a mask/reticle and impart its pattern onto the photosensitive later. However, other types of lithography imager make use of charged particles, such as so-called "direct write" electron beam tools, which trace one or more electron beams over the photosensitive layer according to the desired pattern. Still other lithography imager concepts make use of ion beams. Analogous to the discussion above for a CPM, a lithography imager will also generically comprise a radiation source, illuminator and specimen holder, and will additionally comprise an imaging system in the case of mask-based lithography; moreover, it will generally comprise one or more detectors—though these will typically be used for purposes such as dose/uniformity calibration, positioning (overlay/alignment) verification, etc.

In what follows, embodiments may—by way of example—sometimes be set forth in the specific context of dual-beam microscopy; however, such simplification is intended solely for clarity/illustrative purposes, and should not be interpreted as limiting.

BRIEF DESCRIPTION OF THE DRAWINGS

Like reference numerals refer to corresponding parts throughout the several views of the drawings.

DETAILED DESCRIPTION OF EMBODIMENTS

As regards ion sources, various possibilities, including Liquid Metal Ion Sources (LMIS), plasma sources, photoionization sources, etc., are possible. Of specific interest in the context of embodiments is the collision ionization ion source (e.g. electron impact ionization source), in which an input beam of charged particles (such as electrons) is used to ionize molecules/atoms in a body of gas that is provided in an ionization region. To this end, the gas is introduced into a narrow gap between two oppositely-located retaining plates (sheets, membranes), one of which contains an input zone (such as an aperture, or (locally thinned) lamina/film) to admit said input beam and the other of which contains an oppositely located output zone (conventionally an aperture, but potentially a (locally thinned) lamina/film) to allow emission of a flux of ions produced in said ionization region by interaction of the input beam with the gas. Said interaction will predominantly occur in a gas space bordered on opposite sides by said plates and located between said zones.

Because at least a portion of the gas in question is converted to said ion flux, there needs to be a replenishing supply of gas to said gas space, in order to realize satisfactory continuous operation of the source. In order to achieve a relatively high source brightness, the ionization region is preferably very small, so as to ensure a relatively high density of input charged particles therein; as a consequence, the whole device tends to be very small, with typical zone diameters of the order of a few microns or a few hundred nanometers, for example. For this reason, such sources can also be alluded to as Nano-Aperture Ionization Sources (NAIS), and they are typically manufactured as integrated devices using MEMS technology (MEMS=Micro Electro Mechanical Systems). For more information on NAIS devices, see, for example:

U.S. Pat. No. 7,772,564, assigned to the assignee of the present invention;

The doctoral thesis "Development of the Nano-Aperture Ion Source (NAIS)" by David Sangbom Jun, Delft University of Technology (in conjunction with the assignee of the present invention), ISBN 978-94-6186-384-3 (2014): repository.tudelft.nl/islandora/object/uuid:23a0ceae-2662-4f6a-9082-f21d1a872a39/?collection=research, both of which documents are incorporated herein by reference for all purposes.

NAIS devices are advantageous in that they can be relatively easily used to generate a variety of different ion species—simply by changing the gas administered to the ionization region. Moreover, because they are small and relatively cheap, and can be manufactured en masse using MEMS fabrication techniques, they can be easily and cheaply switched out/replaced when they reach end-of-lifetime. However, an issue up to now has been source brightness, which has tended to remain lower than calculated/simulated nominal brightness levels.

It is an object of embodiments to address this issue. More specifically, it is an object of embodiments to provide an improved collision ionization ion source with an augmented source brightness relative to prior-art devices.

These and other objects are achieved in a collision ionization ion source as set forth herein, characterized in that said duct comprises at least one transition region between said entrance orifice and said emergence orifice in which an inner height of said duct, measured normal to the plates, decreases from a first height value to a second height value.

During extensive experimentation and analysis leading to the development of embodiments, the inventors investigated various possible causes of the disappointingly low source brightness observed in prior-art NAIS devices (in which both the input zone and output zone were tiny apertures). Intuitively, these efforts concentrated on quantum effects in the ionization space, and particularly on factors such as the available density of input charged particles therein, the energy of those charged particles, the input beam cross-section/current, etc. Eventually, after very thorough analysis, the underlying cause was found to lie in a totally unexpected direction: after performing multiple simulations and measurements, it was found that gas leakage through the (tiny) input/output apertures was having a much greater effect on the ionization region than could have been reasonably anticipated, leading to a gas pressure in the ionization region that was one or more orders of magnitude lower than expected—even if the width of the supply channel (parallel to the plane of the inter-plate gap) was much greater than the diameter of the input/output apertures. In order to address this issue, the inventors made significant modifications to the supply duct so as to achieve a much greater gas supply rate to the ionization region, better matching the achievable flow conductance of the supply duct to the (combined) leakage conductance through the apertures; at the same time, such modifications had to (endeavor to) preserve the small dimensioning of the gas space—particularly the small (height) spacing between the abovementioned retaining plates so as to prevent a competing tendency toward lowered brightness due to a lowered density of input charged particles in the ionization region. The inventive architecture uses a supply duct that maintains the desired small "ceiling height" between the retaining plates in the ionization region, but has a relatively high "ceiling height" further upstream in an initial portion extending from the entrance orifice to the transition region. This increased ceiling height produces a lower length-to-height aspect ratio in said initial portion of the gas feedline, advantageously altering the so-called Knudsen number of this initial portion (the ratio of the mean free path length for (atoms/molecules in) the gas to the height of the duct), with an attendant decrease in flow resistance/drag. Accordingly, one creates a situation in which:

For a given gas input pressure (at the entrance orifice), a much higher pressure can be achieved in the ionization region; or In order to achieve a particular gas pressure in the ionization region, one can now suffice with a much lower input pressure (inter alia allowing easier compliance with safety regulations).

Figure 2:
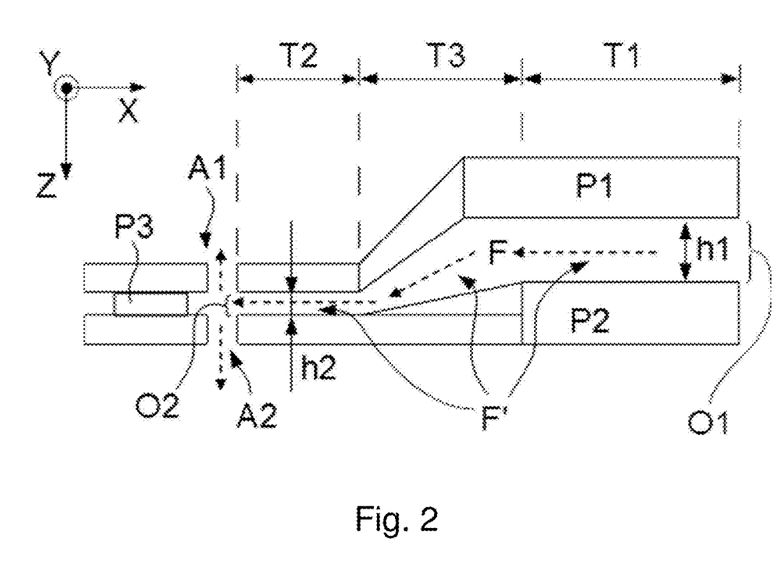
FIG. 2 shows an embodiment (in longitudinal cross-sectional view).

When the new supply duct configuration was tested, it was found that it resulted in a significant increase in source brightness. An embodiment of an inventive arrangement as here described is illustrated in FIG. 2, for example.

The height change in the transition region of the inventive duct geometry can be realized in different ways, and may, for example, have a form selected from the group comprising:

A single step;
A series of steps;
A tapering transition, and combinations thereof.

The particular choice of shape made will depend inter alia on manufacturability considerations. For example, a single step—or series of steps—can be created using an etching procedure, such as a wet etch or sputter etch in combination with a suitable mask, or just a steered FIB/ion-assisted etching technique, for instance. A tapered (sloped portion) transition can, for example, be made by using a FIB to mill to successively different depths as a function of lateral displacement. The chosen form can potentially influence phenomena such as turbulence and dead spaces in the duct, but these have not been found to have a significant effect on the operation of the inventive ion source. The skilled artisan will be able to choose a form/manufacturing technique that best suit the particulars of a given situation.

In an embodiment, a height ratio Q of said first (greater) height value to said second (lesser) height value is greater than 25, preferably greater than 50, and even more preferably greater than 75. The skilled artisan will be able to choose a value of Q according to the needs of a given situation, inter alia based on the desired increase in flow conductance through the supply duct, and on manufacturability considerations. As a non-limiting example, given for the purposes of guidance only, the inventors achieved the following results in a given test:

Height $h_2$ of supply duct at emergence orifice: ~300 nm.
Width of supply duct (parallel to retaining plates): ~100 µm.
Length of supply duct (between entrance and emergence orifices): ~3.3 mm.
Test height $h_1$ of supply duct at entrance orifice: ~7500 nm (yielding Q ~25).

Increasing the duct height at the start of the supply duct in this manner (Q~25) increased the flow conductance through the duct by more than three orders of magnitude (to a value of the order of about 10-10 m3/s, for helium gas at room temperature).

In addition to adjusting the value of Q, there is also the option of employing more than one supply duct, if desired. For example, as an alternative to using a single duct with a large Q, one could instead use several ducts with a smaller Q; in plan view (viewed parallel to the input beam), such multiple supply ducts could converge on a centrally located gas space from different directions, analogous to two or more spokes in a wheel.

It should be noted that the supply duct of the embodiments does not have to emerge directly into the aforementioned gas space. Rather, if desired, there may be a buffer chamber in the vicinity of/surrounding the gas space, and the supply duct can feed the gas space via this buffer chamber.

Figure 1A:
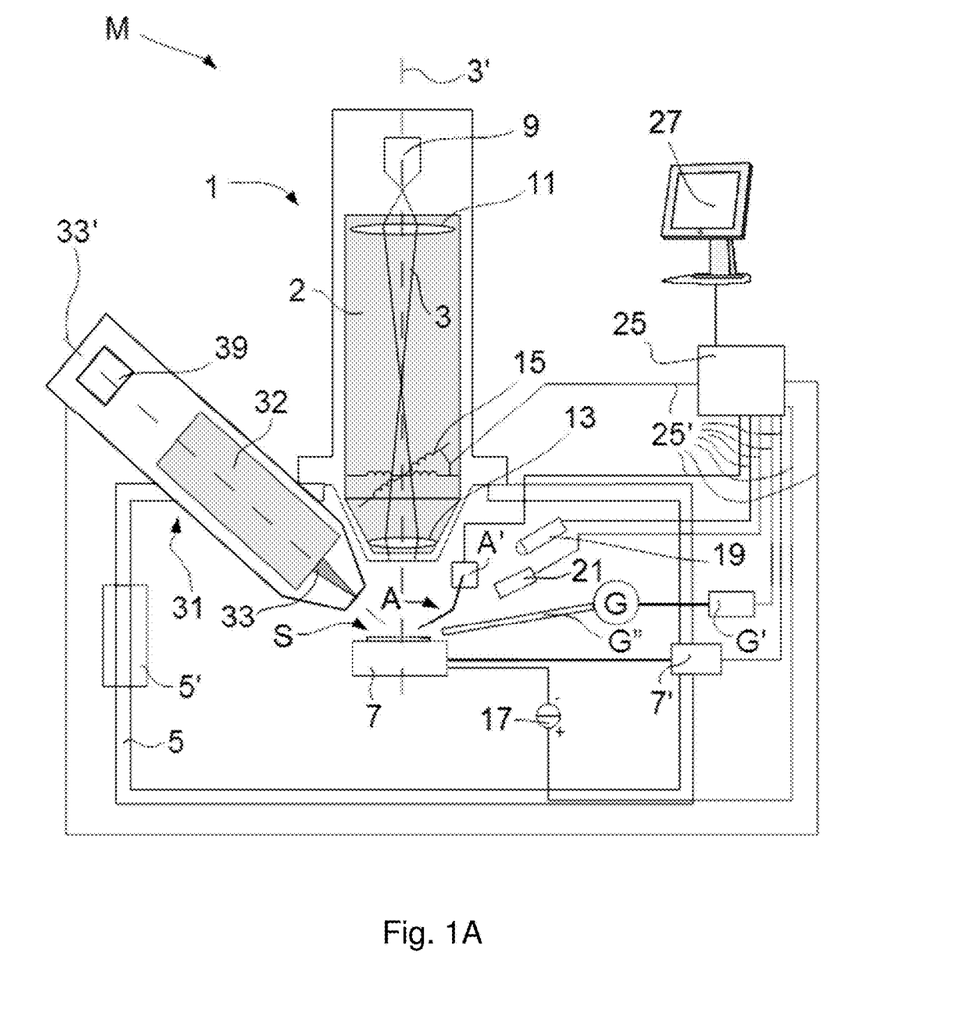
FIG. 1A renders a longitudinal cross-sectional view of a CPM in which an embodiment is implemented.

FIG. 1A is a highly schematic depiction of an embodiment of a charged-particle focusing device—in this case a CPM—in which an embodiment is implemented; more specifically, it shows an embodiment of a microscope M, which, in this case, is a FIB-SEM (though, in the context of embodiments, it could just as validly be a purely ion-based microscope, for example). The microscope M comprises a particle-optical column 1, which produces a beam 3 of charged particles (in this case, an electron beam) that propagates along a particle-optical axis 3'. The particle-optical column 1 is mounted on a vacuum chamber 5, which comprises a specimen holder 7 and associated actuator(s) 7' for holding/positioning a specimen S. The vacuum chamber 5 is evacuated using vacuum pumps (not depicted). With the aid of voltage supply 17, the specimen holder 7, or at least the specimen S, may, if desired, be biased (floated) to an electrical potential with respect to ground. Also depicted is a vacuum port 5', which may be opened so as to introduce/remove items (components, specimens) to/from the interior of vacuum chamber 5. A microscope M may comprise a plurality of such vacuum ports 5', if desired.

The particle-optical column 1 (in the present case) comprises an electron source 9 (such as a Schottky gun, for example) and an illuminator 2. This illuminator 2 comprises (inter alia) lenses 11, 13 to focus the (electron) beam 3 onto the specimen S, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the specimen S in response to irradiation by the (impinging) beam 3. In the apparatus depicted here, the following (non-limiting) detector choices have been made:

Detector 19 is a solid state detector (such as a photodiode) that is used to detect cathodoluminescence emanating from the specimen S. It could alternatively be an X-ray detector, such as Silicon Drift Detector (SDD) or Silicon Lithium (Si(Li)) detector, for example.

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the specimen S.

The skilled artisan will understand that many different types of detector can be chosen in a set-up such as that depicted, including, for example, an annular/segmented detector.

By scanning the beam 3 over the specimen S, stimulated radiation—comprising, for example, X-rays, infrared/visible/ultraviolet light, secondary electrons (SEs) and/or backscattered electrons (BSEs)—emanates from the specimen S. Since such stimulated radiation is position-sensitive (due to said scanning motion), the information obtained from the detectors 19, 21 will also be position-dependent. This fact allows (for example) the signal from detector 21 to be used to produce a BSE image of (at least part of) the specimen S, which image is basically a map of said signal as a function of scan-path position on the specimen S.

The signals from the detectors 19, 21 pass along control lines (buses) 25', are processed by the controller/computer processing apparatus 25, and displayed on display unit 27. Such processing may include operations such as combining, integrating, subtracting, false coloring, edge enhancing, and other processing known to the skilled artisan. In addition, automated recognition processes (e.g. as used for particle analysis) may be included in such processing.

In addition to the particle-optical column 1 described above, the microscope M also comprises an ion-optical column 31. In analogy to the particle (electron) optical column 1, the ion-optical column 31 comprises an ion source 39 and illuminator 32, and these produce/direct an ion beam 33 along an ion-optical axis 33'. To facilitate easy access to specimen S located on specimen holder 7, the ion-optical axis 33' is canted relative to the particle (electron) optical axis 3'. As hereabove described, such an ion-optical (FIB) column 31 can, for example, be used to perform processing/machining operations on the specimen S, such as incising, milling, etching, depositing, etc. Alternatively, the ion-optical column 31 can be used to produce imagery of the specimen S.

As herein depicted, the CPM M makes use of a manipulator arm A, which can be actuated in various degrees of freedom by actuator system A', and can (if desired) be used to assist in transferring specimens to/from the specimen holder 7, e.g. as in the case of a so-called TEM lamella excised from the specimen S using ion beam 33.

Also illustrated is a Gas Injection System (GIS) G, which can be used to effect localized injection of gases, such as etching or precursor gases, etc., for the purposes of performing gas-assisted etching or deposition. Such gases can be stored/buffered in a reservoir G', and can be administered through a narrow nozzle G", so as to emerge in the vicinity of the intersection of axes 3' and 33', for example.

It should be noted that many refinements and alternatives of such a set-up will be known to the skilled artisan, such as the use of a controlled environment at the specimen S, maintaining a pressure of several mbar (as used in an Environmental SEM or low-pressure SEM).

Figure 1B:
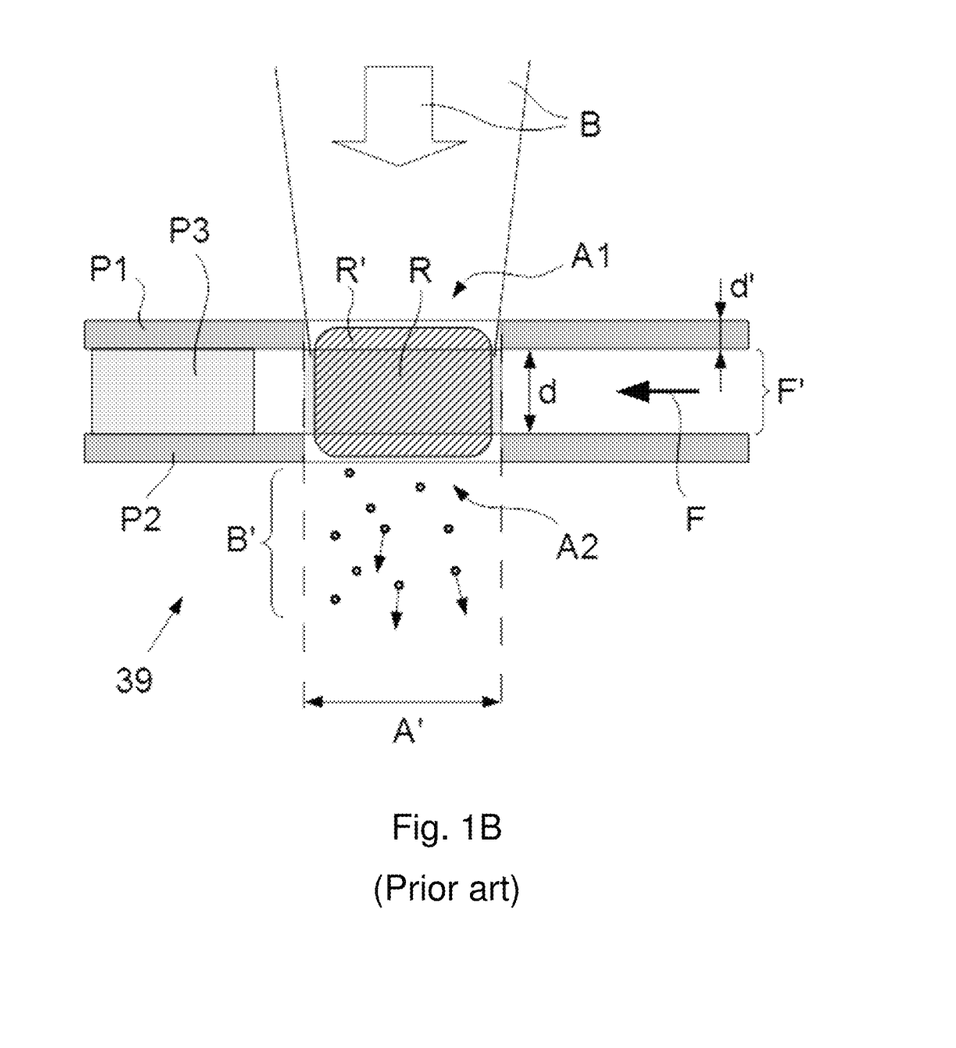
FIG. 1B renders a magnified (longitudinal cross-sectional) view of a prior-art Nano-Aperture Ionization Source (NAIS) ion source, suitable for use in a CPM as depicted in FIG. 1A.

In the specific context of the current disclosure, the ion source 39 is a collision ionization ion source, a NAIS as referred to above. Such an ion source 39 is illustrated in more detail in FIG. 1B, and comprises:

An input aperture (zone) A1, to admit a focused input beam B of charged particles, such as electrons (produced by a non-depicted electron source, such as a Schottky emitter, for instance).

An output aperture (zone) A2, located opposite to, and aligned with, said input aperture A1, to allow emission of a flux B' of ions. As here depicted, both apertures A1 and A2 have a substantially circular form with substantially the same diameter A'.

A gas space R, located between said input aperture A1 and output aperture A2, in which (molecules/atoms of) gas F (such as argon gas, for example) can be ionized by said input beam B so as to produce said ions B'. Such ionization occurs in an ionization region R', which generally is substantially coincident or overlapping with gas space R (though region R' may protrude to some extent through one or both of apertures A1, A2, for example). In the figure, the gas space R is shaded grey, whereas the ionization region R' is schematically indicated using hatching.

A supply duct F', for supplying a flow of said gas F to said gas space R.

As herein depicted, the supply duct F' is delimited by a pair of oppositely-located retaining plates P1, P2 (which, in the case of a NAIS, are thin enough to be referred to as "membranes"). A first plate P1 in this pair contains said input aperture A1, and the second plate P2 contains said output aperture A2, with a spacing/separation d between the plates P1, P2 which essentially defines the (uniform) height of the supply duct F'. Note that a "plug" P3 seals off this duct on one side (the side opposite to the inward flow of gas F from the supply duct). The first plate P1 has a thickness d', and the second plate P2 will often have (approximately) the same thickness. To provide some general guidance, the following non-limiting values may apply to such a depicted ion source 39:

Plate spacing d: ca. 100-500 nm.
Plate thickness d': ca. 100 nm.
Aperture diameter A': ca. 100-500 nm.
Gas pressure in gas space R: ca. 500-750 mbar.
Beam current in beam B: ca. 50-200 nA.

The plates P1, P2 (and plug P3) may, for example, comprise a material such as molybdenum, platinum or tungsten. A voltage supply (not depicted) can be used to apply a (DC) voltage difference between plates P2 and P1 (e.g. ca. 1 volt), so as to bias plate P1 to a more positive potential than plate P2, thereby creating an electric field directing (positively charged) ions towards plate P2 and through aperture A2.

Figure 3:
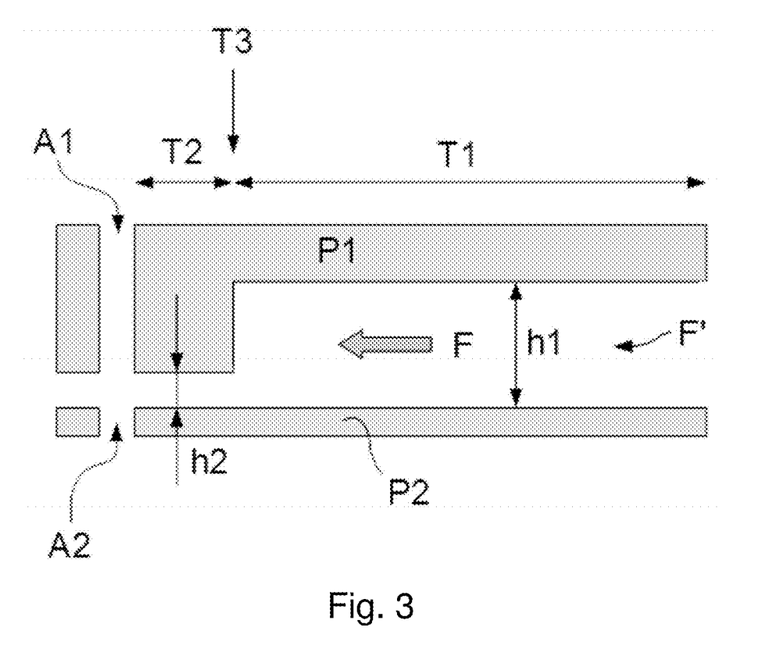
FIG. 3 illustrates an alternative embodiment.

As set forth above, this conventional design of NAIS 59 tends to suffer from sub-optimal brightness. To address this issue, the inventors modified the architecture of the supply duct F' so as to achieve a structure in which the flow conductance of the supply duct F' is better matched to the combined flow conductance of input aperture A1 and output aperture A2. An embodiment of such a modified structure is illustrated in FIG. 2, with reference to a Cartesian coordinate system XYZ. In this Figure, the supply duct F' comprises:

An entrance orifice (mouth/throat) O1, connected to a gas supply (such as a gas pump/reservoir);

An emergence orifice (mouth/throat) O2, opening into gas space R (between apertures A1 and A2), where the duct F' comprises three characteristic portions, namely:

An initial portion/tract T1, with a relatively large height h1 measured parallel to Z forming a first height region, and comprising (progressing from) said entrance orifice O1;

A final portion/tract T2, with a relatively small height h2 measured parallel to Z forming a second height region, and comprising said (progressing to) emergence orifice O2; and At least one transition region/tract T3, between said initial portion T1 and said final portion T2, in which the transition from height h1 to height h2 occurs, producing a non-uniform height between the first plate P1 and second plate P2. This height transition in region T3 can occur smoothly/continuously, in multiple steps, or in a single step change in thickness, as desired/dictated by the circumstances of a given situation. As here depicted, the height transition occurs in a tapering fashion; alternatively, FIG. 3 illustrates an inventive embodiment in which the transition occurs in a step-like fashion.

In this particular embodiment, a dimensional change in the duct F' only occurs in the Z direction; however, this is not limiting upon the scope of the invention, and a dimensional change (tapering or step) could alternatively/additionally occur in the Y direction, if desired. For guidance purposes, the following non-limiting values may apply:

Respective lengths of portions T1, T3 and T2 (parallel to X): 15 mm, 5 μm and 200 μm;

Respective heights of portions T1 and T2 (parallel to Z): 20 μm (h1) and 200 nm (h2). This yields a height ratio $Q=h1/h2=100$ in this case; and Width of portions T1, T2 and T3 (parallel to Y): ca. 100-200 μm.

In use, a gas pressure of ~500 mbar at entrance orifice O1 results in a gas pressure of ~450 mbar at emergence orifice O2, for example.

A structure such as this can, for example, be conveniently manufactured using a chip bonding procedure, whereby the "upper half" (plate P1 forming a top of the supply duct, etc.) and the "lower half" (plate P2 forming a bottom half of the supply duct, etc.) are manufactured on two separate substrates (or substrate portions)—e.g. using etching/ablation techniques—after which one half is inverted onto the other, aligned and bonded in position, using appropriate spacers (such as gas flow plug P3) to help create the interposed duct/channel F'. The apertures A1, A2 can be created using etching/ablation, either prior to or after bonding—for example, a thin actinic (e.g. focused ion) beam can be used to radiatively "drill" through the bonded halves from one side, thus realizing perfect mutual alignment of the apertures. Specific examples of chip bonding techniques in the current context include direct bonding, thermocompression bonding, eutectic bonding, anodic bonding, etc.

What is claimed is:

1. An apparatus comprising:
an ionization region arranged to receive a gas and a charged particle beam, the charged particle beam to ionize at least some of the gas; and
a supply duct arranged to provide the gas to the ionization region, the supply duct having a non-uniform height decreasing from an input orifice to an output orifice, the output orifice arranged adjacent to the ionization region.

2. The apparatus of claim 1, further comprising:
a first plate forming a top of the supply duct and having a first aperture; and
a second plate forming a bottom of the supply duct and having a second aperture,
wherein the first and second apertures are aligned.

3. The apparatus of claim 2, wherein the ionization region is defined by a region between the first and second plates and coincident with the first and second apertures, and wherein the charged particle beam enters the ionization region through the first aperture.

4. The apparatus of claim 2, wherein the charged particle beam enters the ionization region through the first aperture.

5. The apparatus of claim 2, wherein ionized gas exits the ionization region through the second aperture.

6. The apparatus of claim 1, wherein the supply duct is defined by a first height region, a second height region, and a transition region arranged between the first and second height regions.

7. The apparatus of claim 6, wherein the first height region is adjacent to the input orifice and the second height region is adjacent to the output orifice.

8. The apparatus of claim 6, wherein the first height region is larger than the second height region.

9. The apparatus of claim 6, wherein the transition region has a shape selected from one of a taper, a single step, and a multiple step.

10. An apparatus comprising:
a first plate including a first aperture; and
a second plate including a second aperture,
wherein the first and second plates are arranged with their respective apertures aligned, and to form a supply duct of non-uniform height between the first and second plates, and
wherein the supply duct includes a first height region, a transition region and a second height region, the second height region arranged coincident with the first and second apertures, and the first height region separated from the second height region by the transition region, and
wherein the first height region has a height that is greater than the second height region.

11. The apparatus of claim 10, wherein an ionization region is formed between the first and second apertures, the ionization region arranged to receive a charged particle beam through the first aperture to ionize at least some of a gas provided through the supply duct.

12. The apparatus of claim 11, wherein the supply duct incudes an input orifice defined by the first height region and an output orifice defined by the second height region, the supply duct to receive the gas through the input orifice and supply the ionization region the gas through the output orifice.

13. The apparatus of claim 11, wherein the ionized gas exits through the second aperture.

14. The apparatus of claim 10, wherein the transition region includes a step between the first and second height regions.

15. The apparatus of claim 10, wherein the transition region includes multiple steps between the first and second height regions.

16. The apparatus of claim 10, wherein the transition region forms a taper between the first and second height regions.

17. The apparatus of claim 10, wherein the first plate includes a sloped portion that slopes down from the first height region to the second height region, the sloped portion defining the transition region.

18. The apparatus of claim 10, the first plate includes a step change in thickness toward the second plate, the step change in thickness defining the transition region.

19. The apparatus of claim 10, further including a gas flow plug disposed between the first and second plates and disposed on a side of the first and second apertures opposite the supply duct.

20. The apparatus of claim 10, wherein an electric field is formed between the first and second plates.

* * * * *